(12) United States Patent
Kaneko

(10) Patent No.: US 7,485,895 B2
(45) Date of Patent: *Feb. 3, 2009

(54) SILICON CARBIDE SEMICONDUCTOR DEVICE

(75) Inventor: Saichirou Kaneko, Kyoto (JP)

(73) Assignee: Nissan Motor Co., Ltd., Kanagawa-Ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/822,922

(22) Filed: Jul. 11, 2007

(65) Prior Publication Data

US 2007/0262324 A1    Nov. 15, 2007

Related U.S. Application Data

(62) Division of application No. 10/860,093, filed on Jun. 4, 2004, now Pat. No. 7,282,739.

(60) Provisional application No. 60/475,899, filed on Jun. 5, 2003.

(51) Int. Cl.
*H01L 29/15* (2006.01)

(52) U.S. Cl. ............... 257/77; 257/192; 257/E29.104

(58) Field of Classification Search .............. 257/77, 257/192, E29.104
See application file for complete search history.

(56) References Cited

U.S. PATENT DOCUMENTS

| 5,877,515 | A | 3/1999 | Ajit |
| 7,061,027 | B2 | 6/2006 | Tanaka et al. |
| 7,173,307 | B2 * | 2/2007 | Hayashi et al. ............. 257/330 |
| 7,282,739 | B2 * | 10/2007 | Kaneko ...................... 257/77 |

FOREIGN PATENT DOCUMENTS

JP    10-233503    9/1998

* cited by examiner

*Primary Examiner*—Minh-Loan T Tran
(74) *Attorney, Agent, or Firm*—McDermott Will & Emery LLP

(57) ABSTRACT

A silicon carbide semiconductor device is provided with a semiconductor substrate (20) of silicon carbide of a first conductivity type, a hetero semiconductor region (60) forming a hetero-junction with the semiconductor substrate (20), an insulated gate including a gate electrode (40) and a gate insulator layer (30) formed on the semiconductor substrate (20) and adjoining to the hetero semiconductor region (60), a source electrode (80) electrically connected to the hetero semiconductor region (60) and a drain electrode (90) electrically connected to the semiconductor substrate (20).

9 Claims, 14 Drawing Sheets

SILICON CARBIDE SEMICONDUCTOR DEVICE

This application is a Divisional of U.S. application Ser. No. 10/860,093, filed Jun. 4, 2004 now U.S. Pat. No. 7,282,739, claiming benefit of U.S. application No. 60/475,899, filed Jun. 5, 2003, the entire contents of each of which are hereby incorporated by reference.

BACKGROUND OF THE INVENTION

1. Field of the Invention

The present invention relates to a silicon carbide semiconductor device including a field effect transistor to which a silicon carbide semiconductor is applied.

2. Description of the Related Art

Silicon carbide (described as "SiC" hereinafter) has a wide band gap and the maximum dielectric breakdown field strength thereof is one order of magnitude greater than that of silicon (described as "Si" hereinafter). Further, SiC is oxidized to be $SiO_2$ in and, therefore, a thermal oxide layer can be easily formed on a surface of SiC in a similar method as in the case of Si. Therefore SiC is expected to be an excellent material when applied to high-speed/high-voltage switching devices, more particularly, high-power uni/bi-polar devices.

A planer type MOSFET is proposed as an application of SiC.

A related art of the SiC planer type MOSFET is disclosed in Japanese Patent Application Laid-Open H10-233503. According to the disclosure, each unit cell of the SiC planer type MOSFET is provided with a P⁻ type base region in a semiconductor substrate, an N⁺ type source region in the P⁻ type base region and a gate electrode buried in an insulator layer formed on the P⁻ type base region and the N⁺ type source region. A source electrode and a drain electrode are respectively electrically connected to the N⁺ type source region and the semiconductor substrate. When a positive voltage is applied to the gate electrode in a condition where the source electrode and the drain electrode are biased, inversion channel region is generated in the P⁻ type base region in the vicinity of the gate electrode. Thereby current flow can occur from the drain electrode to the source electrode.

SUMMARY OF THE INVENTION

However, it is known that the SiC planer type MOSFET includes a plurality of crystalline imperfections. (V. V. Afanasev, M. Basler, G. Pensl and M. Shulz, Phys. Stat. Sol. (A) 162(1997)321.) The imperfections cause generation of a plurality of interfacial energy levels existing in the inversion channel region, which act as electron traps. Thereby, the channel mobility thereof cannot be made larger and, as a result, ON-state resistance of the SiC planer type MOSFET becomes higher.

The present invention is intended for solving the above problem of the prior art and an object thereof is providing a field effect transistor having low ON-state resistance and high withstand voltage. More specifically, an object of the present invention is providing a silicon carbide semiconductor device of a voltage drive type, which is normally OFF and the production process of which is simple.

According to a first aspect of the present invention, a silicon carbide semiconductor device is provided with a semiconductor substrate of silicon carbide of a first conductivity type, a hetero semiconductor region forming a hetero-junction with the semiconductor substrate, an insulated gate including a gate electrode and a gate insulator layer formed on the semiconductor substrate and adjoining to the hetero-junction, a source electrode electrically connected to the hetero semiconductor region and a drain electrode electrically connected to the semiconductor substrate. Preferably, the semiconductor substrate is further provided with a second conductivity type region opposed to the gate insulator layer.

According to a second aspect of the present invention, a silicon carbide semiconductor device is provided with a semiconductor substrate of silicon carbide of a first conductivity type, a trench formed in the semiconductor substrate, a hetero semiconductor region filled in the trench and forming a hetero-junction with the semiconductor substrate, an insulated gate including a gate electrode and a gate insulator layer formed on the semiconductor substrate and adjoining to the hetero-junction, a source electrode electrically connected to the hetero semiconductor region and a drain electrode electrically connected to the semiconductor substrate. Preferably, the hetero semiconductor region is further provided with a second conductivity type region.

According to a third aspect of the present invention, a silicon carbide semiconductor device is provided with a semiconductor substrate made of silicon carbide of a first conductivity type, a hetero semiconductor region forming a hetero-junction with the semiconductor substrate, a trench extending in a depth direction through the hetero semiconductor region into the semiconductor substrate, an insulated gate filled in the trench, which includes a gate electrode and a gate insulator layer, a source electrode electrically connected to the hetero semiconductor region and a drain electrode electrically connected to the semiconductor substrate.

Concerning with the first through third aspect of the present invention, preferably, the semiconductor substrate is further provided with a second semiconductor region of a first conductivity type, which has a different impurity concentration from the semiconductor substrate, so as to form a second hetero-junction with the hetero semiconductor region. More preferably, the hetero semiconductor region is further provided with a second hetero semiconductor region having a different impurity concentration from the hetero semiconductor region. Further preferably, the hetero semiconductor region is made of a material selected from the group of silicon, amorphous silicon and polycrystalline silicon.

DETAILED DESCRIPTION OF THE PREFERRED EMBODIMENT

Figure 1:
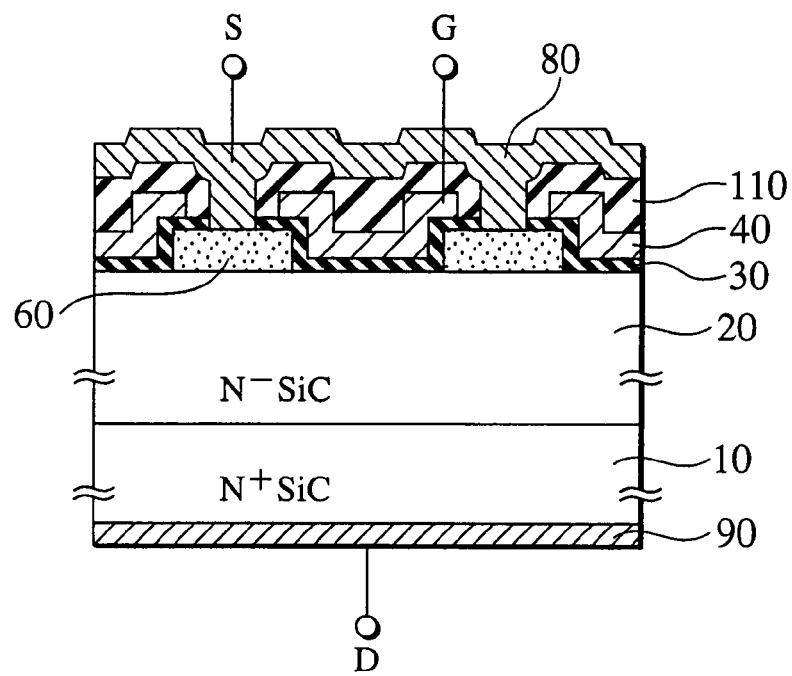
FIG. 1 is a sectional view showing a structure of a silicon carbide semiconductor device of a first embodiment of the present invention.

Embodiments of the present invention will be described hereinafter with reference to the accompanying drawings. In the below description, examples in which polycrystalline silicon (Poly-Si) is applied to a hetero semiconductor region are exemplified. However, any material which forms a hetero junction with SiC can be applied. Further, as a polytype of SiC applied in the present embodiments, 4H is typically exemplified, however, 6H, 3C and such can be also applied. Furthermore, it is needless to say that the embodiments can be modified within the limits of the points of the present invention.

Additionally, throughout the description, a case where a drain electrode and a source electrode are respectively formed on opposing sides of a semiconductor substrate so that a current flow occurs in the vertical direction thereof is exemplified. However, for example, the present invention can be also carried out by means of disposing the drain electrode and the source electrode on one surface of the semiconductor substrate so that the current flow occurs in the horizontal direction thereof.

Furthermore, the below description will be given to a unit cell, however, a plurality of unit cells are formed on a semiconductor substrate in parellel.

A first embodiment of the present invention will be described hereinafter with reference to FIG. 1. An N⁻ type epitaxial region 20 is formed on an N⁺ type SiC substrate 10. In predetermined regions on the epitaxial region 20, an N⁻ type polycrystalline silicon layer 60 is formed. The polycrystalline silicon layer 60 forms a hetero junction with the epitaxial region 20. An energy barrier is generated at the junction interface by the junction electric field. Additionally, adjoining to the junction between the epitaxial region 20 and the polycrystalline silicon layer 60, a gate insulator layer 30 is formed and extended onto the polycrystalline silicon layer 60. A gate electrode 40 is formed further thereon. An interlayer insulator layer 110 is formed on and covers the gate electrode 40 for insulation from a source electrode 80. The source electrode 80 is electrically connected to the polycrystalline silicon layer 60. On a backside surface of the N⁺ type SiC substrate 10, a drain electrode 90 is formed.

The silicon carbide semiconductor device is operated in a condition where the source electrode 80 is held at a ground potential and a positive voltage $V_d$ is applied to the drain electrode 90. And then, in a case where the gate electrode 40 is held at a ground potential, a reverse biased hetero junction diode is formed between the N⁻ type polycrystalline silicon layer 60 and the SiC epitaxial region 20. Therefore current flow between the drain electrode 90 and the source electrode 80 does not occur until the drain voltage $V_d$ reaches an enough high voltage $V_b$. However, when the drain voltage $V_d$ goes beyond the voltage $V_b$, a current flow suddenly occurs by: a tunneling phenomenon. On the other hand, in a case where a positive voltage is applied to the gate electrode 40, an electric field acts on the hetero junction interface between the N⁻ type polycrystalline silicon layer 60 and the SiC epitaxial region 20 so that the concentrated electric field makes the energy barrier formed at the hetero junction interface thinner. As a result, even in a case where the drain voltage $V_d$ is lower than the predetermined voltage $V_b$, a current flow starts by the tunneling phenomonon.

The current between the drain electrode 90 and the source electrode 80 can be controlled by means of controlling voltage applied to the gate electrode 40 in a condition where the drain voltage $V_d$ is kept below the voltage $V_b$. Thereby the silicon carbide semiconductor device according to the present invention controls the current flow.

Figure 13:
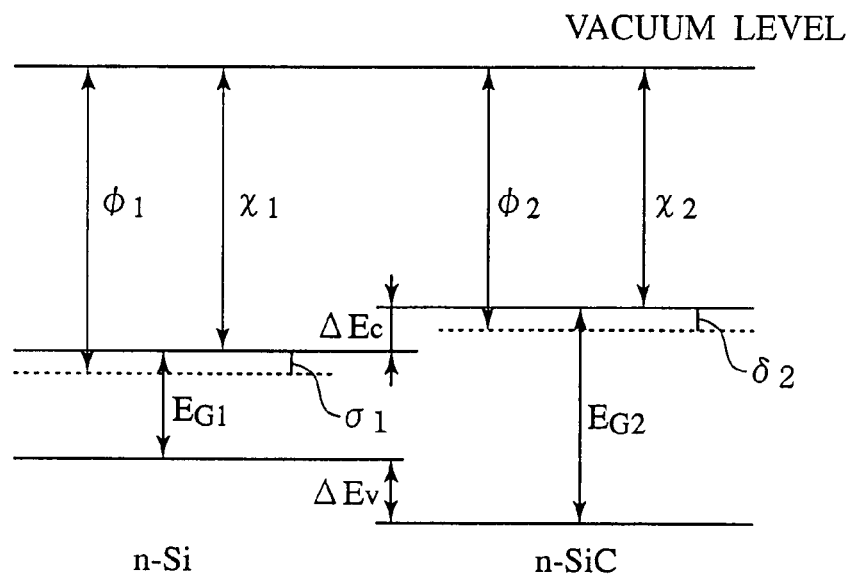
FIG. 13 is an energy-band drawing between Si and 4H—SiC before contact.
Figure 14:
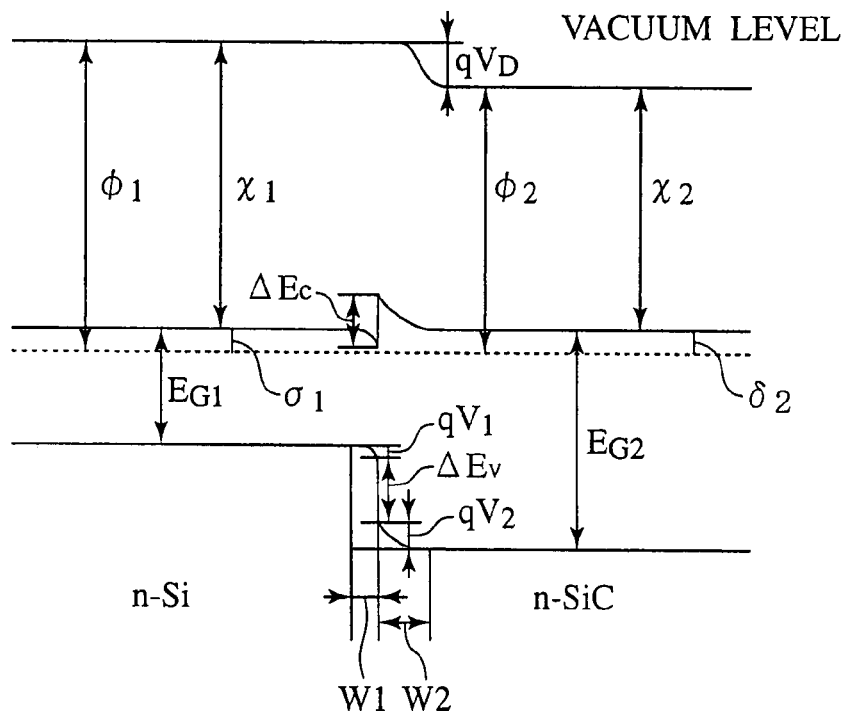
FIG. 14 is an energy-band drawing between Si and 4H—SiC after contact.
Figure 15:
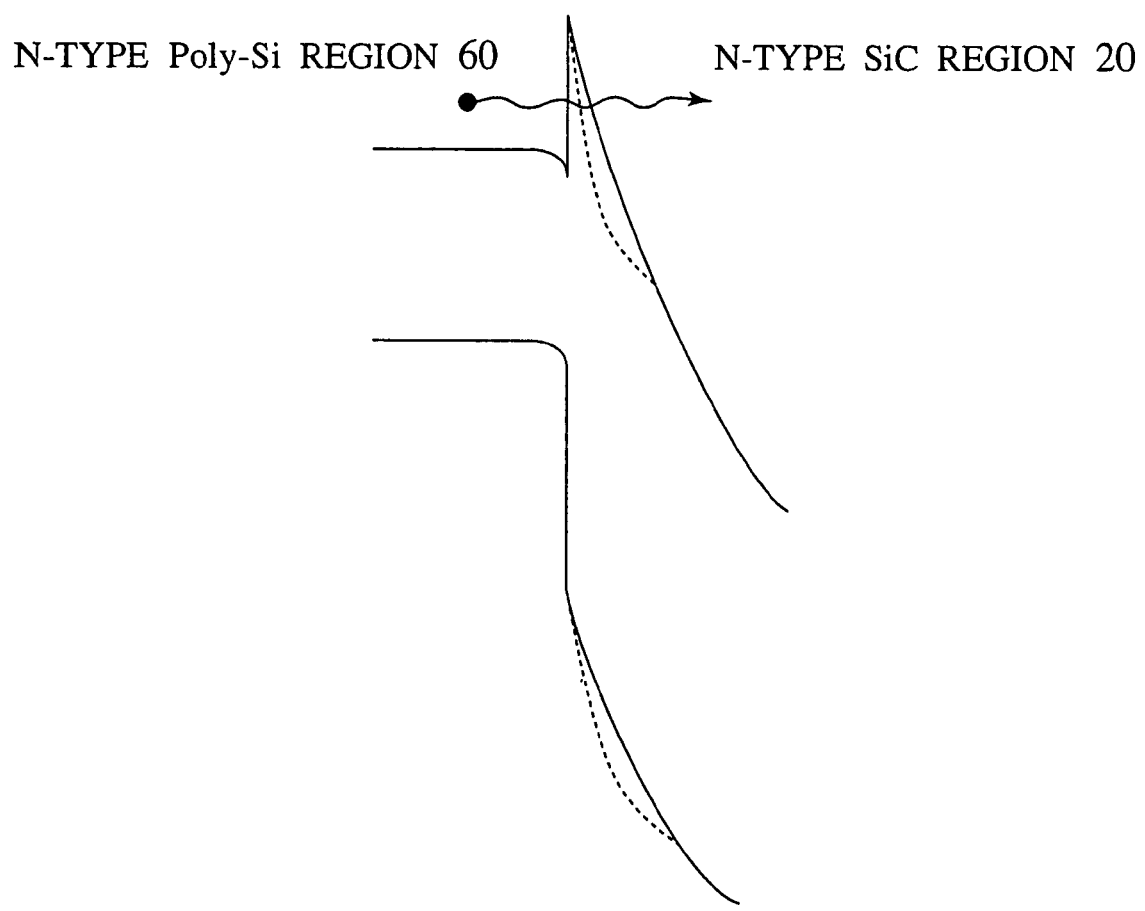
FIG. 15 is an energy-band drawing between Si and 4H—SiC when a drain voltage is applied.

Next, characteristics of a hetero junction formed between the polycrystalline silicon and the SiC will be described hereinafter with reference to FIGS. 13 to 15. FIGS. 13-15 show energy band structures of N⁻ type silicon and N⁻ type 4H—SiC before and after forming a hetero junction. Throughout the drawings, N⁻ type silicon is described on the left hand thereof and N⁻ type 4H—SiC is described on the right hand thereof. Furthermore, for ease of explanation, the drawings show energy band structures of N⁻ type silicon instead of N⁻ type polycrystalline silicon which is applied to the aforementioned first embodiment.

FIG. 13 shows a state before forming a hetero junction. In the drawing, concerning silicon, $X_1$ is an electron affinity, $\phi_1$ is a working function (energy from a vacuum level to a Fermi level), $\delta_1$ is a Fermi energy (energy from a conductive band to the Fermi level) and $E_{G1}$ is a band gap. Similarly, concerning 4H—SiC, $X_2$ is an electron affinity, $\phi_2$ is a working function, $\delta_2$ is a Fermi energy and $E_{G2}$ is a band gap.

After forming the hetero junction, the energy band structure comes to be a state shown in FIG. 14. At an interface of the hetero junction, a difference of the electron affinities between the silicon and the 4H—SiC induces a junction electric field and the junction electric field deforms the energy band structure. Thereby an energy barrier $\Delta E_c$ is generated.

$$\Delta E_c = X_1 - X_2 \tag{1}$$

For ease of explanation, an ideal hetero junction, in which interface energy levels are disregarded, is supposed so as to consider the energy levels thereof.

Provided that the aforementioned consideration is applied to the semiconductor device shown in FIG. 1, the energy band structure at the junction interface between the N⁻ type polycrystalline silicon layers 60 and the N⁻ type 4H—SiC epitaxial region 20 can be approximately illustrated as FIG. 15 in full lines, in which a positive voltage $V_d$ is applied to the drain electrode 90 in a state where the gate electrode 40 are held at a ground potential. A depletion layer corresponding to the drain voltage $V_d$ is dispersed in the vicinity of the junction interface on the side of 4H—SiC epitaxial region 20. Electrons in polycrystalline silicon layer 60 cannot get across the energy barrier $\Delta E_c$ so as to be stored at the junction interface, thereby a current flow hardly occurs. Electric flux lines induced by the depletion layer which is dispersed in the vicinity of the junction interface on the side of 4H—SiC epitaxial region 20 are terminated at the layer where the electrons are stored. Thereby the layer where the electrons are stored shields the polycrystalline silicon layer 60 from the electric field induced by the depletion layer. Therefore a case where a breakdown at the polycrystalline silicon layers 60 happens in advance is prevented. A current flow from the drain electrode 90 to the source electrode 80 does not occur until the drain voltage $V_d$ reaches the predetermined $V_b$.

In a case where a positive voltage is applied to the gate electrode 40, an electric field acts on the interface of the hetero junction between the N⁻ type polycrystalline silicon layer 60 and the SiC epitaxial region 20 so that the energy barrier formed at the hetero junction interface becomes thinner as shown in FIG. 19 in broken lines. When the energy barrier is thin enough, for example approximately 100 Å, the electrons can pass through the barrier by the tunneling phenomenon. As a result, even if the drain voltage $V_d$ is lower than the predetermined voltage $V_b$, a current flow starts by the tunneling phenomenon.

The aforementioned hetero junction includes a very similar characteristic of a so-called Schottky junction, which is a junction between a semiconductor and a Schottky metal. However, the hetero junction between the polycrystalline silicon and the SiC has more preferable properties in comparison with the Schottky junction in view of the points described below.

More detailed description about the characteristic of the hetero junction between the polycrystalline silicon and the SiC will be given hereinafter with reference to FIG. 14.

When the silicon contacts with the 4H—SiC because electrons move from the 4H—SiC to the silicon, it can be assumed that an electron storage layer having a width of W1 is formed in the silicon in the vicinity of the junction interface and a depletion layer having a width of W2 is formed in the 4H—SiC. A diffusion potential formed at the junction interface is:

$$V_D=(\delta_1+\Delta E_c-\delta_2)/q \qquad (2)$$

$$V_D=V_1+V_2 \qquad (3)$$

Where $V_D$ is the diffusion potential, $V_1$ and $V_2$ are ingredients of the diffusion potential respectively distributed to the side of the silicon and the side of the 4H—SiC, $\delta_1$ and $\delta_2$ are respective energy differences between the Fermi level and the conduct ion band and q is an electric charge of an electron, because $qV_D$ is a Fermi level energy difference therebetween.

The thickness W2 of the depletion layer formed in the 4H—SiC is:

$$W2=\{(2\cdot\in 0\cdot\in 2\cdot V_2)/(q\cdot N2)\}^{1/2} \qquad (4)$$

Where $\in 0$ is a dielectric constant in vacuum, $\in 2$ is a specific dielectric constant of the 4H—SiC and N2 is an ionization impurity concentration in the 4H—SiC. These equations are considered, for ease of consideration, provided that an ideal state is achieved and strain effects are disregarded, and further, the consideration of a model of band discontinuity is on the basis of Anderson's electron affinity.

According to the semiconductor device of the present invention shown in FIG. 1, the main current is controlled by applying a voltage to the gate electrode so as to decrease the thickness of the energy barrier as shown in FIG. 15. Therefore, if W2 described in the equation (4) is increased, the control of the tunneling current by the gate voltage becomes difficult. On the other hand, if W2 is made thinner, the tunneling current through the barrier can be flowed by a lower gate voltage, thereby the energy main current is easily controlled by means of the gate voltage. However, the breakdown voltage $V_b$ of the device becomes smaller, thereby it is impossible to gain a device having a high withstand drain voltage.

In the equation (4), W2 is a function of the $V_2$ and the V2 is an ingredient of the diffusion potential $V_D$, which is formed at the hetero junction, on the side of the 4H—SiC (as described in the equation (3)), therefore, if $V_D$ is made larger, $V_2$ becomes larger, and vice versa.

Namely, the width W2 of the depletion layer formed on the side of the SiC can be controlled by changing the ionization impurity concentration in the polycrystalline silicon. As a result, W2 can be changed while controlling the tunneling current by means of the gate voltage is consistent with gaining an expected hetero junction withstand voltage. This is an outstanding advantage of the hetero junction between the polycrystalline silicon and the SiC.

Regarding the junction between the Schotkey metal and the SiC, the working function of the Schotkey metal is specific to the material. In that case, W2 cannot be changed unless changing the material of the Schotkey metal.

Though the aforementioned description had been given in a case of the N type polycrystalline silicon and the N type SiC, a P type polycrystalline silicon and the N type SiC are also applicable. Additionally, a P type polycrystalline silicon and a P type SiC are also applicable.

Furthermore, not limited to a combination of silicon and polycrystalline silicon, amorphous silicon can be applied.

Next, an example of production methods of the silicon carbide semiconductor device according to the first embodiment will be described hereinafter with reference to FIGS. 10A-10F.

Figure 10A:
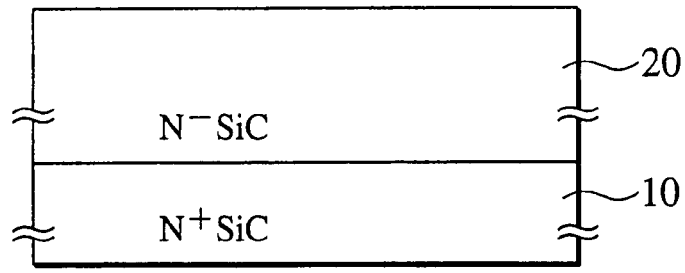
FIGS. 10A-10F are sectional drawings showing a production process of the silicon carbide semiconductor device of the first embodiment of the present invention.

In a step shown in FIG. 10A, the N⁻ type SiC epitaxial region 20, for example, an impurity concentration of which is in a range from $10^{14}$ to $10^{18}$ cm$^{-3}$ and a thickness of which is in a range from 1 to 100 μm, is formed on the N⁺ type SiC substrate 10.

Figure 10B:
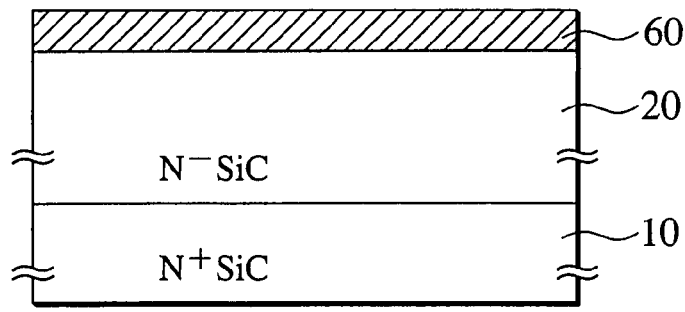

In a step shown in FIG. 10B, sacrificial oxidation is achieved on the epitaxial region 20. After removing the sacrificial oxide film, the polycrystalline silicon layer 60 is deposited thereon by a low-pressure CVD method, the thickness of which is, for example, in a level from 1 to 10 μm. Next, the polycrystalline silicon layer 60 is implanted with a predetermined impurity so as to be the N⁻ type polycrystalline silicon layer 60. As the implantation method, the impurity is thermally diffused from another layer deposited on the polycrystalline silicon, which is doped in a high concentration, by heating in a temperature range from 600 to 1000° C., or the impurity is directly implanted into the polycrystalline silicon layer 60 by an ion implantation method.

Figure 10C:
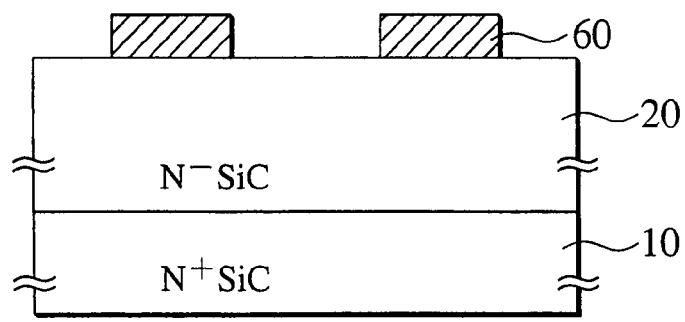

In a step shown in FIG. 10C, patterning is achieved on the polycrystalline silicon layer 60 so that N⁻ type polycrystalline silicon layer 60 is formed.

Figure 10D:
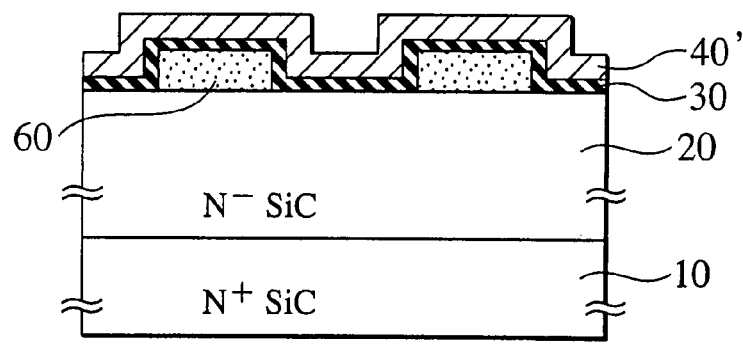

In a step shown in FIG. 10D, the gate insulator layer 30 is formed by means of, for example, depositing CVD oxidation layer, and polycrystalline silicon layer 40' is further deposited thereon in a thickness in a level from 0.1 to 10 μm by a low-pressure CVD method. After that, a predetermined impurity is implanted into the polycrystalline silicon layer 40'.

Figure 10E:
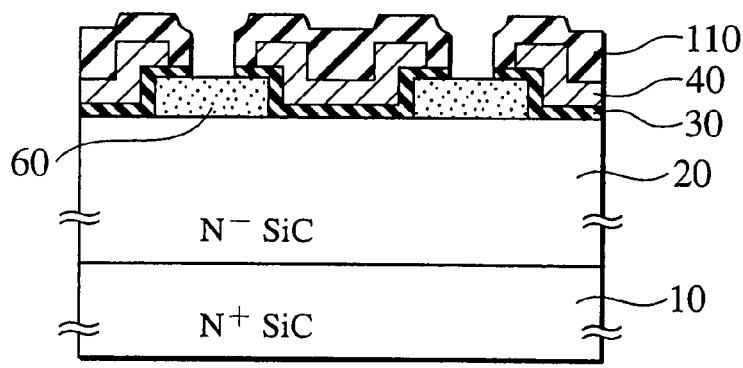

In a step shown in FIG. 10E, patterning is achieved on the polycrystalline silicon layer 40' so that the gate electrode 40 is formed.

In addition, in the first embodiment, the example in which the impurity is doped into the polycrystalline silicon layers 60 and 40' after deposition of the polycrystalline silicon layers 60 and 40' has been described, however, the patterning of the polycrystalline silicon layers 60 and 40' may be achieved before the doping of the impurity. Furthermore, to increase a carrier mobility in the polycrystalline silicon layer 60, annealing of the N⁻ type polycrystalline silicon layer 60 may be achieved so that the polycrystalline silicon layer 60 may be single-crystallized or a grain size thereof may be grown. In addition, the crystallization can be achieved by means of laser radiation onto the polycrystalline silicon layer 60.

Next, the interlayer insulator layer 110 is formed and patterned. The interlayer insulator layer 110 and the gate insulator layer 30 are etched with, for example, an HF solution so that contact holes are opened.

Figure 10F:
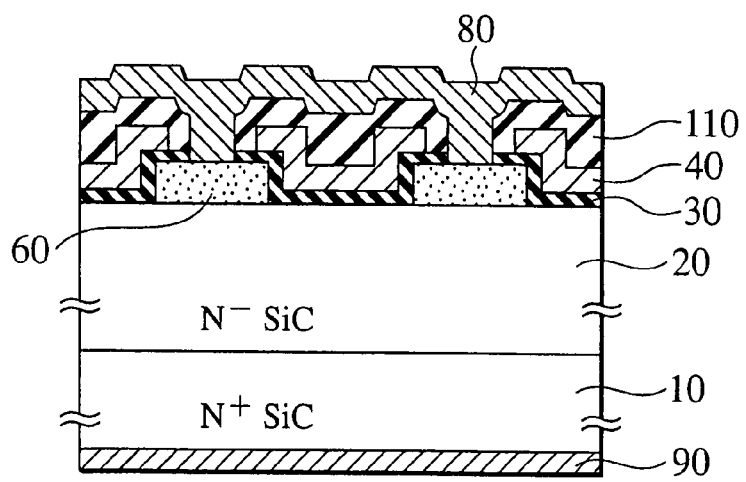

In a step shown in FIG. 10F, the source electrode 80 made of, for example, metal is formed so as to contact the N⁻ type polycrystalline silicon layer 60 and a metal layer as the drain electrode 90 is vapor-deposited on the backside surface of the SiC substrate 10 and heat-treated at a temperature from 600 to 1300° C. so as to be an ohmic contact.

The silicon carbide semiconductor device as shown in FIG. 1 is thus finished.

Namely, the silicon carbide semiconductor device is characterized by being provided with a semiconductor substrate of silicon carbide of a first conductivity type (the N⁺ type SiC substrate 10 and the N⁻ type SiC epitaxial region 20), a hetero semiconductor region (the N⁻ type polycrystalline silicone layer 60) forming a hetero-junction with the semiconductor substrate, an insulated gate including a gate electrode 40 and a gate insulator layer 30 formed on the semiconductor substrate and adjoining to the hetero-junction, a source electrode 80 electrically connected to the hetero semiconductor region and a drain electrode 90 electrically connected to the semiconductor substrate.

In the silicon carbide semiconductor device;

1: When a positive voltage is applied to the gate electrode 40 so that the thickness of the energy barrier is made smaller, carriers can pass through the thinner energy barrier (by tunneling phenomenon). Namely, in a state where a positive voltage is applied to the drain, the thickness of the energy barrier is controlled by means of the electric field from the gate electrode 40 so that the main current flowing in the semiconductor device can be controlled. Thereby, in the semiconductor device according to the present invention, a channel structure of MOSFET does not exist so that ON-state resistance is reduced and it can be operated as a voltage-driven type device as with MOSFET.

2: According to the semiconductor device of the first embodiment, in the course of a process of a basic device structure thereof, conductivity control of the silicon carbide semiconductor substrate is not necessary, therefore the present semiconductor device can be produced by a simple production process. Because the conductivity control is not necessary, some steps of the production process can be eliminated, for example, high-temperature annealing at approximately 1700° C. for activation of ions implanted into the silicon carbide semiconductor substrate, so that a load of the production process can be reduced, and problems caused by the high-temperature, such as a surface roughness, can be prevented.

3: Furthermore, regions such as a well and a contact thereof are unnecessary to be provided so that the present device structure has a miniaturization advantage relative to such a device structure.

A second embodiment of the present invention will be described hereinafter with reference to FIG. 2.

Figure 2:
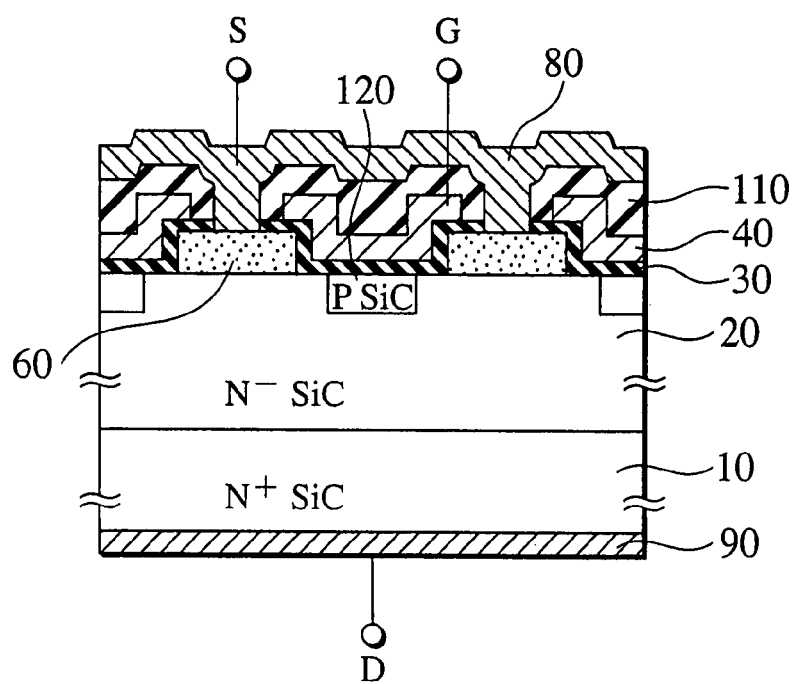
FIG. 2 is a sectional view showing a structure of a silicon carbide semiconductor device of a second embodiment of the present invention.

A constitutional difference of the second embodiment shown in FIG. 2 from the first embodiment shown in FIG. 1 is that a P⁻ type SiC region 120 is formed in the epitaxial region 20 and the gate insulator layer 30 is formed directly thereon so that the gate insulator layer 30 and the gate electrode 40 are opposite to the P⁻ type SiC region 120. Namely, the epitaxial region 20 is further provided with a second conductivity type region (the P⁻ type SiC region 120) opposed to the gate insulator layer 30. As a result, an electric field applied to the gate insulator layers 30 responsive to the drain voltage is relieved by means of existence of the P⁻ type SiC region 120, thereby the reliability of the gate insulator layer 30 is increased.

However, conductivity control is necessary to form the P⁻ type SiC regions.

A third embodiment of the present invention will be described hereinafter with reference to FIG. 3.

Figure 3:
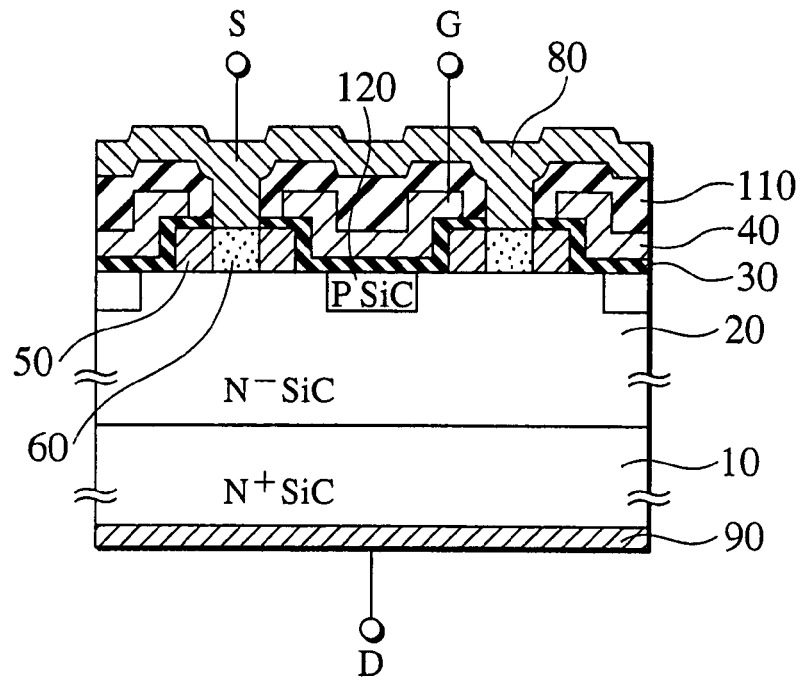
FIG. 3 is a sectional view showing a structure of a silicon carbide semiconductor device of a third embodiment of the present invention.

A constitutional difference of the third embodiment shown in FIG. 3 from the second embodiment shown in FIG. 2 is that both side regions, each of which is adjoining to the insulator layer 30, of the polycrystalline silicon layer 60 are further doped with impurity so as to be N⁺ type polycrystalline silicon layers 50. Namely, it is characterized in that the hetero semiconductor region further includes a second hetero semiconductor region (the N⁺ type polycrystalline silicon layers 50) having a different impurity concentration from the hetero semiconductor region (the N⁻ type polycrystalline silicon layer 60).

Because the N⁺ type polycrystalline silicon layer 50 forms a hetero junction with the N⁻ type 4H—SiC epitaxial region 20, the diffusion potential $V_D$ induced at the junction is made smaller in comparison with a hetero junction between the N⁻ type polycrystalline silicon layer 60 and the N⁻ type 4H—SiC epitaxial region 20. Thereby the width W2 of the depletion layer spread into the N⁻ type 4H—SiC epitaxial region 20 becomes smaller and a threshold of the gate voltage for starting the tunneling current flow through the barrier is lowered. Thereby the control of the energy main current by the gate voltage becomes easy. Then, the withstand voltage of the junction between the N⁺ type polycrystalline silicon layer 50 and the N⁻ type 4H—SiC epitaxial region 20 is low. However, an electric field applied to the junction between the N⁺ type polycrystalline silicon layer 50 and the N⁻ type 4H—SiC epitaxial region 20 is shielded by the depletion layer spread from the junction interface into the N⁻ type 4H—SiC epitaxial region 20 so that lowering of the drain withstand voltage can be prevented.

Namely, the silicon carbide semiconductor device of the third embodiment provides an effect of improvement in controllability of the device main current by the gate voltage in addition to the effect set forth in the second embodiment.

A fourth embodiment of the present invention will be described hereinafter with reference to FIG. 4.

Figure 4:
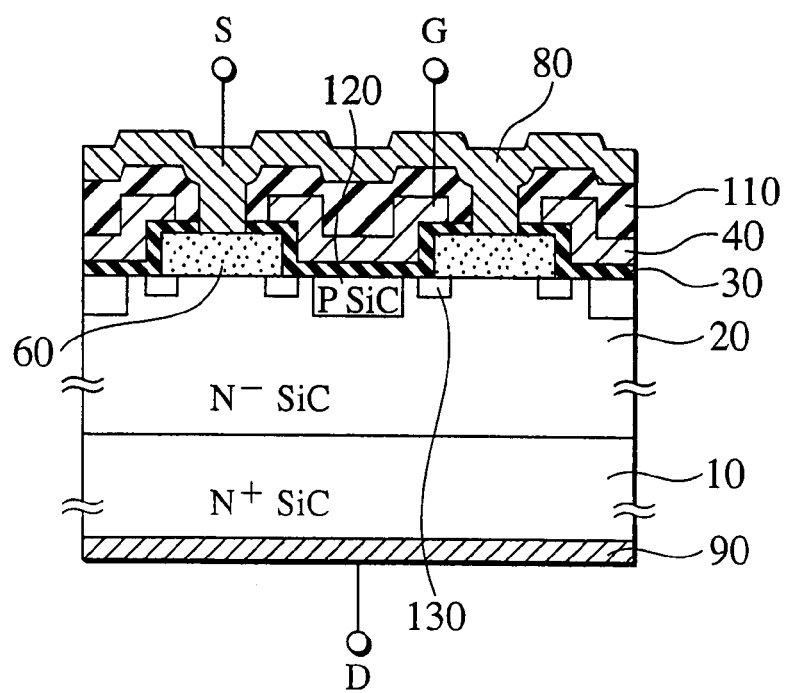
FIG. 4 is a sectional view showing a structure of a silicon carbide semiconductor device of a fourth embodiment of the present invention.

A constitutional difference of the fourth embodiment shown in FIG. 4 from the third embodiment shown in FIG. 3 is that N⁻ type SiC regions 130 are formed in the N⁻ type SiC epitaxial region 20 and disposed at the respective edges of the junction interface between the N⁻ type polycrystalline silicon layer 60 and the N⁻ type SiC epitaxial region 20. The N⁻ type SiC regions 130 are doped with ionization impurity in a higher concentration than the N⁻ type SiC epitaxial region 20. Thereby a width of the depletion layer spread into the N⁻ type SiC regions 130 by a diffusion potential becomes smaller so that the energy barrier is formed thinner. As a result, a threshold of the gate voltage for starting the tunneling current flow through the energy barrier is lowered. Thereby the control of the energy main current by the gate voltage becomes easy.

Namely, the semiconductor substrate further includes a second semiconductor region (the N⁻ type SiC region 130) of a first conductivity type so as to form a second hetero-junction with the hetero semiconductor region. The second semiconductor region has a different impurity concentration from the semiconductor substrate.

A fifth embodiment of the present invention will be described hereinafter with reference to FIG. 5.

The N⁻ type epitaxial region 20 is formed on the N⁺ type SiC substrate 10 as a drain region like as the aforementioned first embodiment. Trench 70 is formed on predetermined region in the expitaxial region 20. An N⁻ type polycrystalline silicon layer 60 and an N⁺ type polycrystalline silicon layer 50 is filled in the trench 70. The polycrystalline silicon layers 50 and 60 form hetero junctions with the SiC epitaxial region 20, and energy barriers are formed at the junction interfaces. Additionally, adjacent to the polycrystalline silicon layer 50, a gate insulator layer 30 is formed on the epitaxial region 20 and extended onto the polycrystalline silicon layer 50. A gate electrode 40 is formed further thereon. An interlayer insulator layer 110 is formed on and covers the gate electrode 40 for insulation from a source electrode 80. The source electrode 80 is electrically connected to the N⁺ type polycrystalline silicon layer 50. On the backside surface of the N⁺ type SiC substrate 10, a drain electrode 90 is formed.

An operation of the silicon carbide semiconductor device of the fifth embodiment is basically similar to the first embodiment. Namely, the silicon carbide semiconductor device is operated in a condition where the source electrode 80 is held at a ground potential and a positive voltage $V_d$ is applied to the drain electrode 90. And then, in a case where the gate electrode 40 is held at a ground potential, a reverse biased hetero junction diode is formed between the N⁻ type polycrystalline silicon layer 60 and the SiC epitaxial region 20 so that current flow therebetween is prevented. On the other hand, in a case where a positive voltage is applied to the gate electrode 40, an electric field acts on the hetero junction interface between the N⁻ type polycrystalline silicon layers 60 and the SiC epitaxial region 20 so that the concentrated electric field makes the energy barrier formed at the hetero junction interface thinner. As a result, even in a case where the drain voltage $V_d$ is lower than the predetermined voltage $V_b$, a current flow starts by the tunneling phenomenon.

Figure 5:
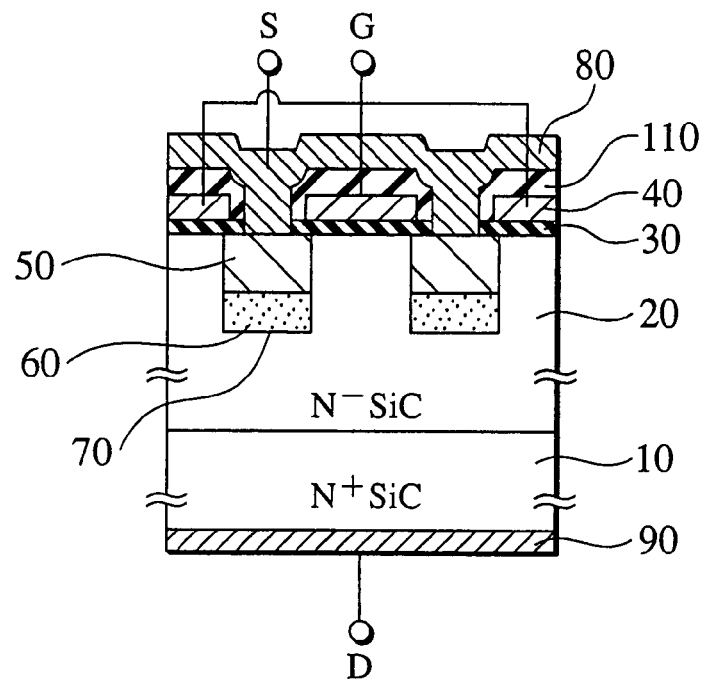
FIG. 5 is a sectional view showing a structure of a silicon carbide semiconductor device of a fifth embodiment of the present invention.

A constitutional difference of the fifth embodiment shown in FIG. 5 from the first embodiment shown in FIG. 1 is that the trench 70 is formed and the N⁻ type polycrystalline silicon layer 60 and the N⁺ type polycrystalline silicon layer 50 are filled therein.

The hetero junction interfaces are formed at side walls of the trench 70 and the gate electrode 40 is disposed adjacent thereto so that the length of electric flux lines therebetween can be shortened. Thereby controllability of the thickness of the energy barrier by the electric field induced by the gate electrode 40 becomes higher. In other words, a threshold of the gate voltage for starting the tunneling current flow through the barrier is lowered. Thereby the control of the energy main current by means of the gate current becomes easy.

Additionally, reasons why two regions of the N⁺ type polycrystalline silicon layers 50 and the N⁻ type polycrystalline silicon layers 60 are formed in the trench 70, which are distinctive in impurity concentrations thereof, are as follows. The N⁺ type polycrystalline silicon layer 50 has a higher impurity concentration so as to lower a threshold of the gate voltage to start a tunneling current flow. The N⁻ type polycrystalline silicon layer 60 has a lower impurity concentration so as to raise a drain withstand voltage. Such configuration markedly improves the device characteristic.

Next, a production method of the silicon carbide semiconductor device according to the fifth embodiment will be described hereinafter with reference to FIGS. 11A-11F.

Figure 11A:
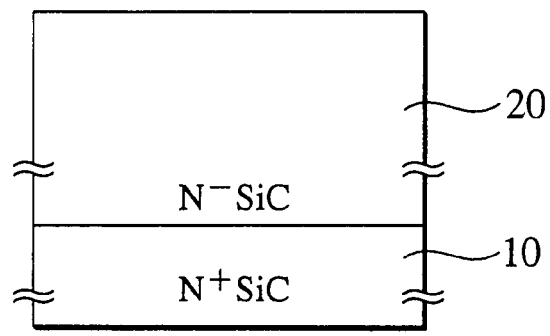
FIGS. 11A-11F are sectional drawings showing a production process of the silicon carbide semiconductor device of the fifth embodiment of the present invention.

First, in a step shown in FIG. 11A, the N⁻ type SiC epitaxial region 20 is formed on the N⁺ type SiC substrate 10. An impurity concentration thereof is in a range from $10^{14}$ to $10^{18}$ cm⁻³ and a thickness thereof is in a range from 1 to 100 μm for example.

Figure 11B:
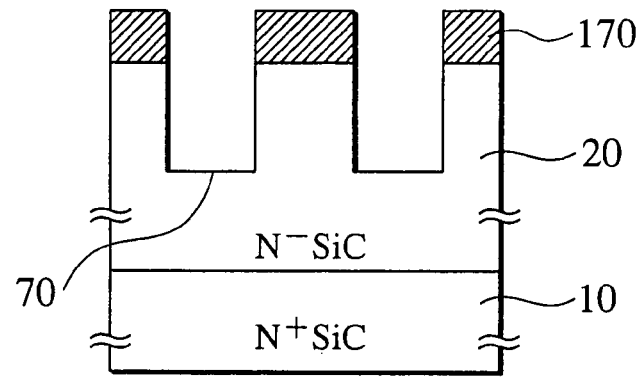

In a step shown in FIG. 11B, a mask 170 is adhered thereon and etching is achieved so as to form the trenches 70. A depth thereof is in a range from 0.1 to 10 μm for example.

Figure 11C:
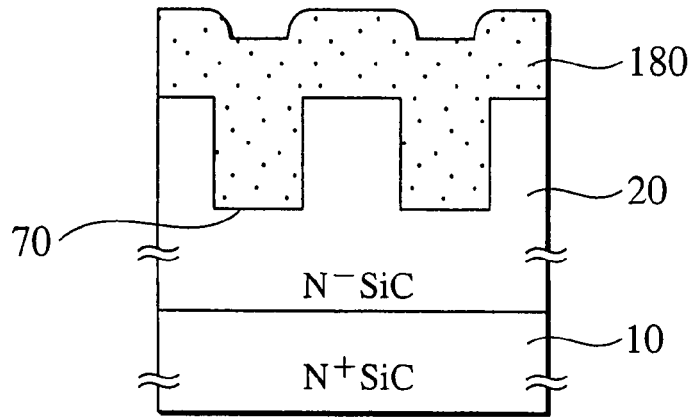

In a step shown in FIG. 11C, sacrificial oxidation is achieved on the epitaxial region 20. After removing the sacrificial oxide film, the polycrystalline silicon layer 180 is deposited thereon by a low pressure CVD method, the thickness of which is, for example, in a level from 1 to 10 μm. Next, the polycrystalline silicon layer 180 is implanted with a predetermined impurity so as to be N⁻ conductivity type. For achieving the implantation, a highly doped layer, which is doped with an impurity in a higher concentration, is deposited on the polycrystalline silicon. Consequently thermal diffusion is achieved by heating in a temperature range from 600 to 1000° C. Or, instead, an ion implantation method can be applied so as to directly implant the impurity into the polycrystalline silicon layer 180.

Figure 11D:
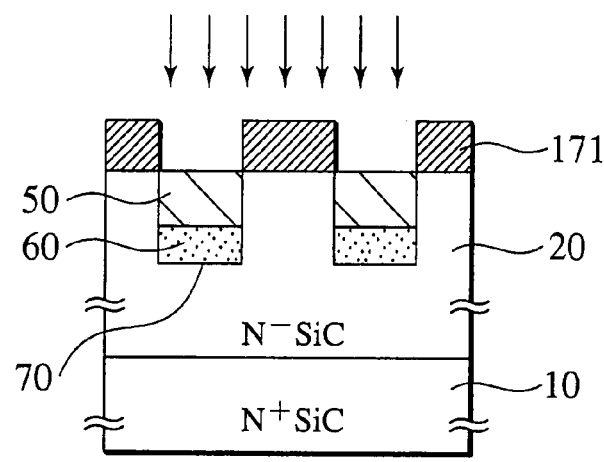

In a step shown in FIG. 11D, the polycrystalline silicon layer 180 over the trenches 70 is removed by means of mechanical-chemical-polishing, for example, a CMP method. Next, a mask 171 is adhered thereon and a predetermined impurity is implanted into the N⁻ type polycrystalline silicon layers 180 in the trenches 70 to a predetermined depth so that the N⁺ type polycrystalline silicon layers 50 are formed therein. Then, the polycrystalline silicon layers 180 still left under the N⁺ type polycrystalline silicon layers 50 are the N⁻ type polycrystalline silicon layers 60.

Figure 11E:
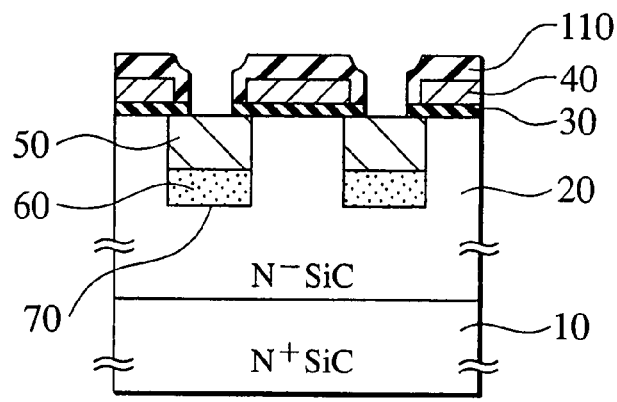

In a step shown in FIG. 11E, oxide layers are deposited by means of, for example, a CVD method so as to form the gate insulator layers 30 and polycrystalline silicon layers are further deposited thereon in a thickness in a level from 0.1 to 10 μm by a low-pressure CVD method. After that, a predetermined impurity is implanted into the polycrystalline silicon layers. Next, patterning is achieved on the polycrystalline silicon layers so that the gate electrodes 40 are formed.

In addition, in the fifth embodiment, the example in which the impurity is doped into the polycrystalline silicon layers after depositing the polycrystalline silicon layers (180 or ones for forming the gate electrodes 40) has been described, however, the patterning of the polycrystalline silicon layers may be achieved before doping of the impurity. Furthermore, the polycrystalline silicon layers 50 may be single-crystallized or annealed so that a grain size thereof is made larger. Thereby a carrier mobility in the polycrystalline silicon layers is increased.

Next, the interlayer insulator layers 110 are formed and patterning is achieved. The interlayer insulator layers 110 and the gate insulator layers 30 are etched with, for example, an HF solution so that contact holes are opened.

Figure 11F:
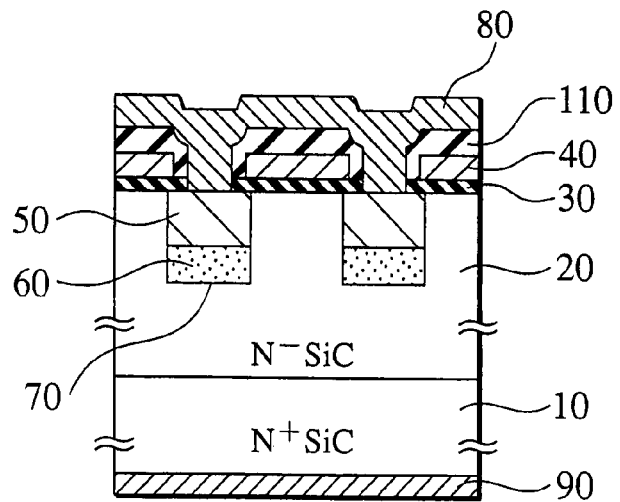

In a step shown in FIG. 11F, the source electrode 80 made of, for example, metal is formed so as to contact the N⁺ type polycrystalline silicon layer 50. A metal layer as the drain electrode 90 is vapor-deposited on the backside surface of the SiC substrate 10. Heat-treatment at a temperature from 600 to 1300° C. is achieved so as to make the contacts to be ohmic contacts.

The silicon carbide semiconductor device as shown in FIG. 5 is thus completed.

Namely, the silicon carbide semiconductor device is provided with a semiconductor substrate of silicon carbide of a first conductivity type, a trench 70 formed in the semiconductor substrate, a hetero semiconductor region (the N⁻ type polycrystalline silicon layer 60 and the N⁺ type polycrystalline silicon layer 50) filled in the trench 70 and forming a hetero-junction with the semiconductor substrate, an insulated gate including a gate electrode 40 and a gate insulator layer 30 formed on the semiconductor substrate and adjoining to the hetero-junction, a source electrode 80 electrically connected to the hetero semiconductor region and a drain electrode 90 electrically connected to the semiconductor substrate.

A sixth embodiment of the present invention will be described hereinafter with reference to FIG. 6.

Figure 6:
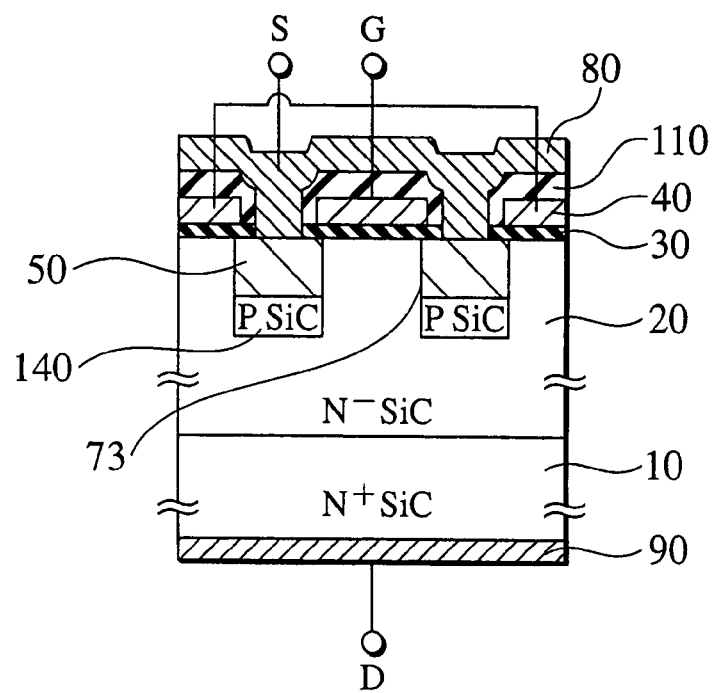
FIG. 6 is a sectional view showing a structure of a silicon carbide semiconductor device of a sixth embodiment of the present invention.

A constitutional difference of the sixth embodiment shown in FIG. 6 from the fifth embodiment shown in FIG. 5 is that a P⁻ type SiC region 140 is formed instead of the N⁻ type polycrystalline silicon layer 60. Namely, the hetero semiconductor region is further provided with a second conductivity type region (the P⁻ type SiC region 140). A withstand voltage of the device is determined by an inverse direction withstand voltage of the diode formed between the P⁻ type SiC region 140 and the N⁻ type SiC epitaxial region 20, thereby the device can be made to have a high-withstand voltage.

However, a conductivity control is necessary to form the P⁻ type SiC regions 140.

A seventh embodiment of the present invention will be described hereinafter with reference to FIG. 7.

A constitutional difference of the seventh embodiment from the fifth embodiment is that an N⁺ type polycrystalline silicon region 51 are formed so as to be enclosed by an N⁻ type polycrystalline silicon layer 61 and that an N⁻ type SiC region 130 is formed between the N⁻ type polycrystalline silicon layer 61 and the same of adjacent another device.

The N⁻ type SiC region 130 is formed so as to have higher concentration of ionization impurity than the N⁻ type SiC epitaxial regions 20. Thereby the width of the depletion layer spreading from the junction interface between the N⁻ type polycrystalline silicon layer 61 and the N⁻ type SiC region 130 to the N⁻ type SiC region 130 formed by diffusion potential become smaller so that the energy barrier is made thinner. As a result, a threshold of the gate voltage for starting the tunneling current flow through the barrier is lowered so that control of the energy main current by the gate voltage becomes easy.

Figure 7:
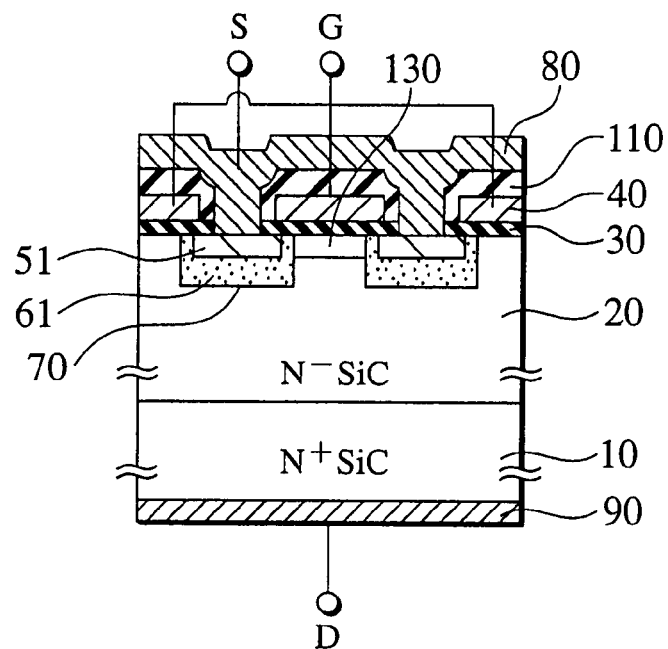
FIG. 7 is a sectional view showing a structure of a silicon carbide semiconductor device of a seventh embodiment of the present invention.

Additionally, in FIG. 7, the gate electrodes 40 are formed so as to reach the N⁺ type polycrystalline silicon layers 51 in a substrate surface direction. However, the gate electrodes 40 are not necessary to reach them. However, in a case where the gate electrodes 40 reach the N⁺ type polycrystalline silicon layers 51, the resistance of the N⁻ type polycrystalline silicon layers 61 is depressed when positive voltage is applied to the gates so that the elements are ON.

An eighth embodiment of the present invention will be described hereinafter with reference to FIG. 8.

Figure 8:
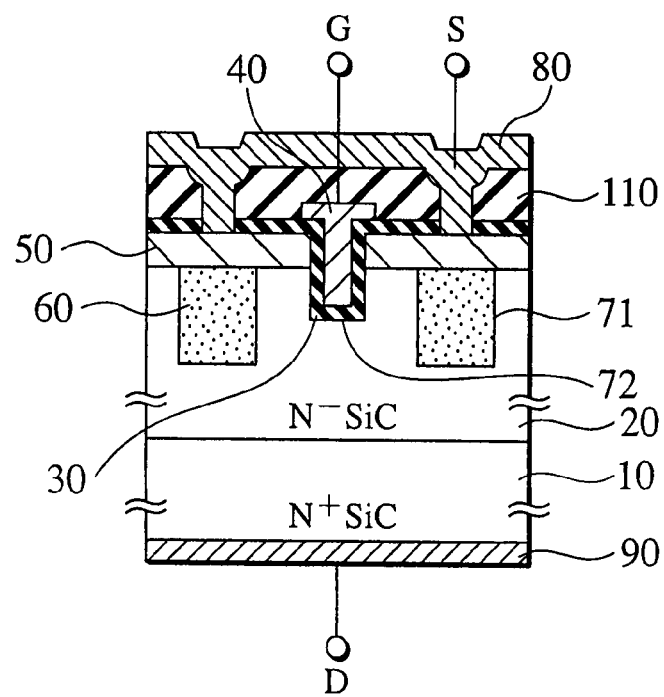
FIG. 8 is a sectional view showing a structure of a silicon carbide semiconductor device of an eighth embodiment of the present invention.

According to the present embodiment, two unit cells are formed in pairs as shown in FIG. 8.

An N⁻ type epitaxial region 20 is formed on an N⁺ type SiC substrate 10 so as to be a drain region. At predetermined regions on the epitaxial region 20, trenches 71 are formed and N⁻ type polycrystalline silicon layers 60 are respectively filled therein. On the N⁻ type polycrystalline silicon layers 60, an N⁺ type polycrystalline silicon layer 50 is deposited. A trench 72 is formed on the N⁺ type polycrystalline silicon layer 50 and disposed between a pair of the N⁻ type polycrystalline silicon layers 60 so as to penetrate the N⁺ type polycrystalline silicon layer 50 and to reach the N⁻ type polycrystalline silicon layers 60. A gate insulator film 30 is formed and covers side surfaces and a bottom of the trench 72. The gate insulator film 30 is further partly extended onto the N⁺ type polycrystalline silicon layer 50. A gate electrode 40 is formed further on the gate insulator film 30 so that the gate electrode 40 and the gate insulator film 30 fill the trench 72. An interlayer insulator layer 110 is formed on the gate electrode 40 and covers the gate electrode 40 and the gate insulator film 30. A source electrode 80 is further formed thereon so as to be electrically connected to the N⁺ type polycrystalline silicon layer 50. On the backside surface of the N⁺ type SiC substrate 10, a drain electrode 90 is formed.

An operation of the silicon carbide semiconductor device of the present embodiment is similar to the device according to the fifth embodiment. Namely, the device of the present embodiment is employed in a state where the source electrode 80 is held at a ground potential and a positive voltage $V_d$ is applied to the drain electrode 90. In a case where the gate electrode 40 is held at a ground potential, a reverse biased hetero junction diode is formed between the N⁻ type polycrystalline silicon layer 60 and the SiC epitaxial region 20. On the other hand, in a case where a positive voltage is applied to the gate electrode 40, an electric field acts on the hetero junction interface between the N⁺ type polycrystalline silicon layer 50 and the SiC epitaxial region 20 so that the concentrated electric field makes the energy barrier formed at the hetero junction interface thinner. As a result, even in a case where the drain voltage $V_d$ is lower than the predetermined voltage $V_b$, a current flow starts by the tunneling phenomenon.

Structural differences of the eighth embodiment shown in FIG. 8 in comparison with the fifth embodiment shown in FIG. 5 are that the trench 72 is formed and the gate electrode 40 is filled in the trench 72.

Such an UMOS gate (or trench MOS gate) structure is formed so that an effective area of the device is made larger in view of a substrate area and a current density can be increased.

Next, a production method of the silicon carbide semiconductor device according to the eighth embodiment will be described hereinafter with reference to FIGS. 12A-12H.

Figure 12A:
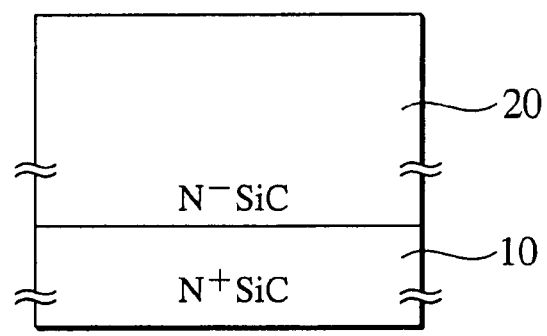
FIGS. 12A-12H are sectional drawings showing a production process of the silicon carbide semiconductor device of the eighth embodiment of the present invention.

First, in a step shown in FIG. 12A, the N⁻ type SiC epitaxial region 20 is formed on the N⁺ type SiC substrate 10. An impurity concentration thereof is, for example, in a range from $10^{14}$ to $10^{18}$ cm⁻³ and a thickness thereof is in a range from 1 to 100 μm.

Figure 12B:
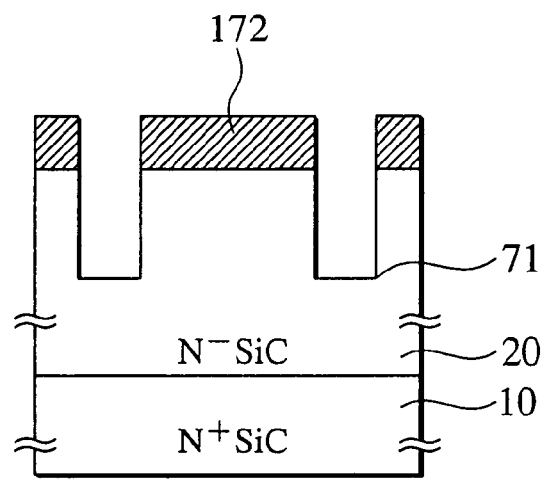

In a step shown in FIG. 12B, a mask 172 is adhered thereon and etching is achieved so as to form the trenches 71. A depth thereof is in a range from 0.1 to 10 μm.

Figure 12C:
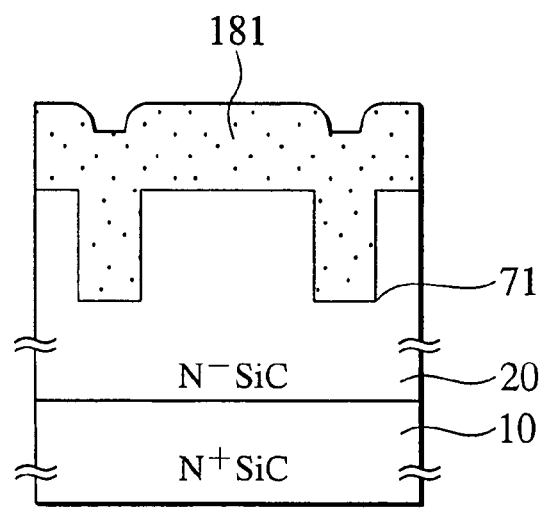

In a step shown in FIG. 12C, sacrificial oxidation is achieved on the epitaxial region 20. After removing the sacrificial oxide film, the polycrystalline silicon layer 181 is deposited thereon by a low-pressure CVD method, the thickness of which is, for example, in a level from 1 to 10 μm. Next, the polycrystalline silicon layer 181 is implanted with a predetermined impurity so as to be N⁻ conductivity type. For achieving the implantation, a highly doped layer, which is doped with an impurity in a higher concentration, is deposited on the polycrystalline silicon. Consequently thermal diffusion is achieved by heating in a temperature range from 600 to 1000° C. Or, instead, an ion implantation method can be applied so as to directly implant the impurity into the polycrystalline silicon layer 181.

Figure 12D:
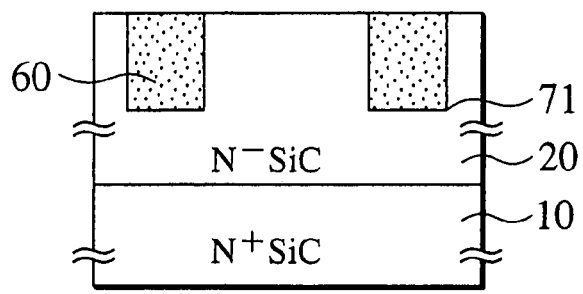

In a step shown in FIG. 12D, the polycrystalline silicon layer 181 over the trenches 71 is removed by means of mechanical-chemical-polishing, for example, by a CMP method.

Figure 12E:
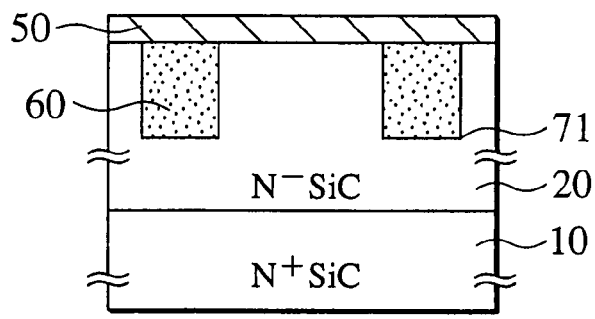

In a step shown in FIG. 12E, the polycrystalline silicon layer 50 is deposited thereon by a low-pressure CVD method, the thickness of which is, for example, in a level from 0.1 to 5 μm. Next, the polycrystalline silicon layer 50 is implanted with a predetermined impurity so as to be the N+ type polycrystalline silicon layer 50. Such implantation can be achieved by means of either thermal diffusion from another highly doped layer deposited on the polycrystalline silicon by heating in a temperature range from 600 to 1000° C. or direct ion implantation into the polycrystalline silicon layer 50.

Figure 12F:
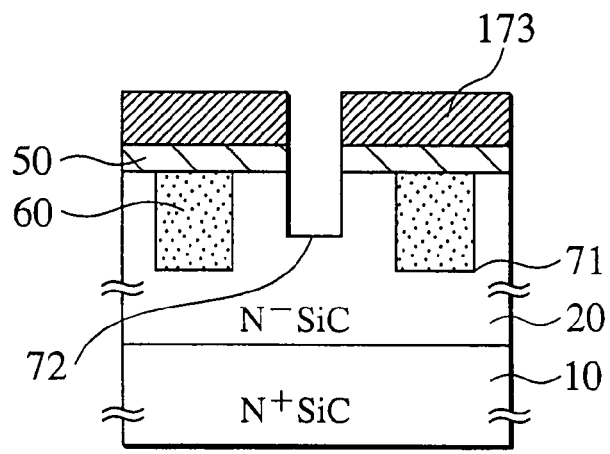

In a step shown in FIG. 12F, the trenches 71, for example, having depth in a range from 0.1 to 10 μm are formed so as to penetrate the N+ type polycrystalline silicon layer 50 in a depth direction to reach the N− type SiC region.

Figure 12G:
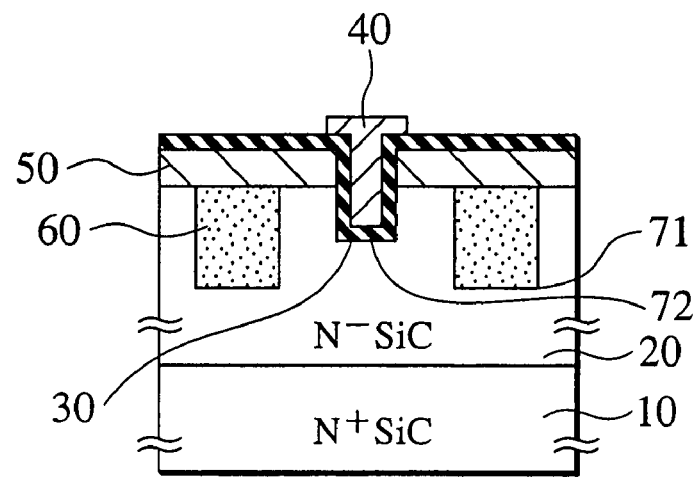

In a step shown in FIG. 12G, an interlayer insulator layer 30 is formed on the surface of the N+ type polycrystalline silicon layer 50 and the inner surface of the trenches 72 by means of a CVD method. Further, on the interlayer insulator layer 30, a polycrystalline silicon layer is deposited in a thickness, for example, in a range from 0.1 to 10 μm by a low-pressure CVD method. After that, a predetermined impurity is implanted into the polycrystalline silicon layer. Next, patterning is achieved on the polycrystalline silicon layer so as to form gate electrodes 40.

Additionally, according to the above-described eighth embodiment, the example in which the impurity is doped into the polycrystalline silicon layers (181, 50 or for gate electrode 40) after depositing. However, patterning of the polycrystalline silicon layer can be achieved before doping the impurity. Furthermore, the polycrystalline silicon layers 50 may be sigle-crystallized or annealed so that a grain size thereof is made larger. Thereby a carrier mobility in the polycrystalline silicon layers is increased. In addition, the crystallization can be achieved by means of laser radiation onto the polycrystalline silicon layers 60.

Figure 12H:
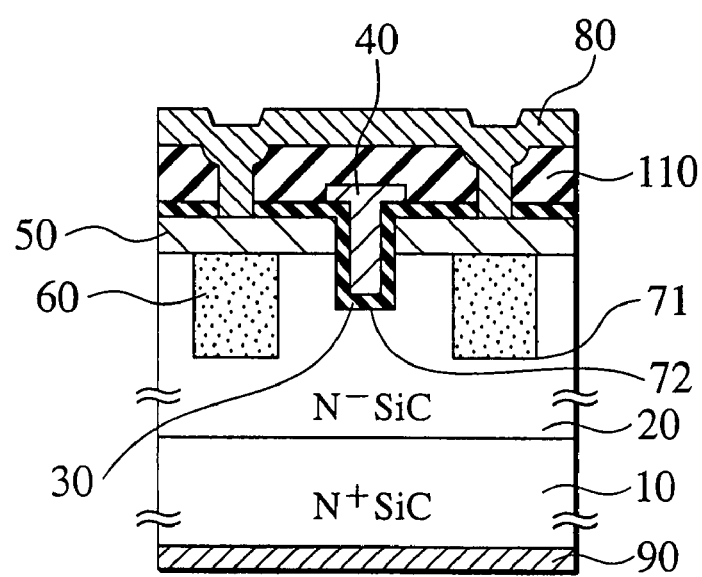

In a step shown in FIG. 12H, an interlayer insulator layer 110 is deposited on interlayer insulator layer 30 and the gate electrodes 40 and patterning is achieved. Etching of the interlayer insulator layer 110 and the interlayer insulator layer 30 is achieved with an HF solution for example so as to open contact holes.

The source electrode 80 made of, for example, metal, is formed so as to contact with the N+ type polycrystalline silicon layer 50. A metal film as the drain electrode 90 is vapor-deposited on the backside surface of the SiC substrate 10 and is heat-treated at a temperature, for example, in a range from 600 to 1300° C. so as to make the contacts to be ohmic contacts.

Thus the silicon carbide semiconductor device shown in FIG. 8 is completed.

More specifically, the silicon carbide semiconductor device of the present eighth embodiment is characterized by being provided with a semiconductor substrate made of silicon carbide of a first conductivity type, a hetero semiconductor region (a N− type polycrystalline silicon layer 60 and a N+ type polycrystalline silicon layer 50) forming a hetero-junction with the semiconductor substrate, a trench 72 extending in a depth direction through the hetero semiconductor region into the semiconductor substrate, an insulated gate filed in the trench 72, which includes a gate electrode 40 and a gate insulator layer 30, a source electrode 80 electrically connected to the hetero semiconductor region and a drain electrode 90 electrically connected to the semiconductor substrate.

Figure 9A:
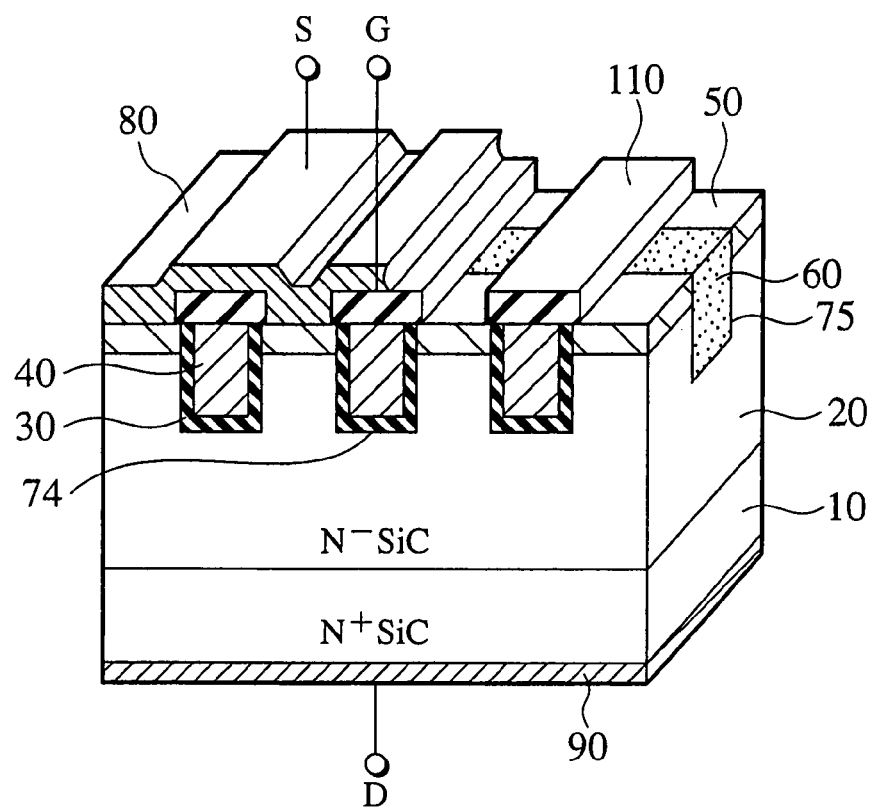
FIG. 9A is a sectional view showing a structure of a silicon carbide semiconductor device of a ninth embodiment of the present invention and FIG. 9B is a plan view thereof.
Figure 9B:
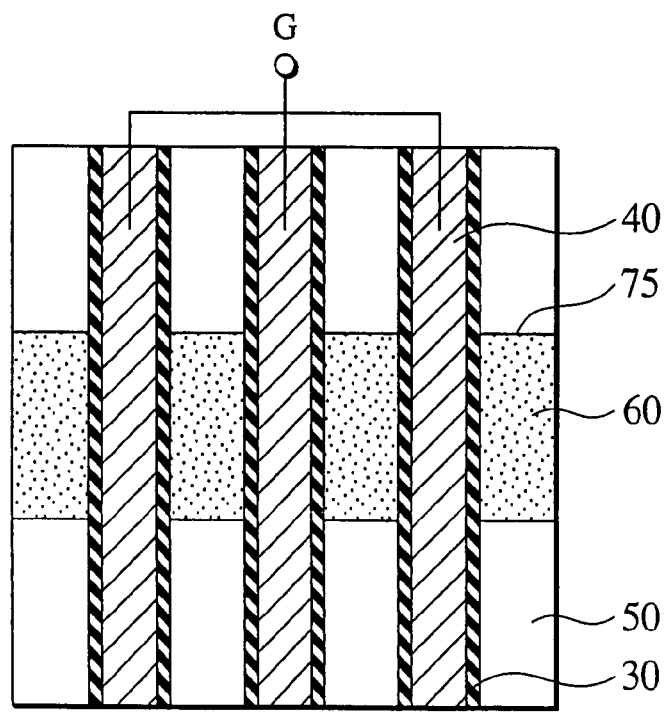

FIG. 9A is a sectional perspective view showing a structure of the silicon carbide semiconductor device according to the ninth embodiment of the present invention and FIG. 9B is a plan view thereof.

A constitutional difference of the ninth embodiment from the eighth embodiment is that the N− type polycrystalline silicon layer 60 is formed so as to be filled in a trench 75 which is not shown in the sectional view of FIG. 8.

Constituted as such, it is possible to increase an effective area of the device and a current density.

The contents of Japanese Patent Application No. 2002-125412 (filed Apr. 26, 2002) are incorporated herein by reference in its entirety.

Although the invention has been described above by reference to certain embodiments of the invention, the invention is not limited to the embodiments described above. Modifications and variations of the embodiments described above will occur to those skilled in the art, in light of the above teachings.

What is claimed is:

1. A semiconductor device comprising:
   a drain region including a first semiconductor of a first conduction type;
   a source region including a second semiconductor having a band gap different from that of the first semiconductor, the source region forming hetero junction with the drain region;
   a gate insulator in contact with the hetero junction; and
   a gate conducting region having the gate insulator interposed between the gate conducting region and the hetero junction.

2. The semiconductor device of claim 1, wherein the first semiconductor includes a highly doped silicon carbide semiconductor and a lowly doped silicon carbide epitaxial region being epitaxial with the highly doped silicon carbide semiconductor, and the epitaxial region forms the hetero junction with the source region.

3. The semiconductor device of claim 2, wherein the epitaxial region includes a second conduction type region in contact with the gate insulator.

4. The semiconductor device of claim 2, wherein the epitaxial region includes a trench filled with the source region.

5. The semiconductor device of claim 2, wherein the epitaxial region includes a second conduction type region in contact with the source region.

6. The semiconductor device of claim 2, further comprising:
   a trench penetrating the source region to reach the epitaxial region, the trench being filled with the gate insulator in contact with the epitaxial region and the gate conduction region having the gate insulator interposed between the gate conduction region and the epitaxial region.

7. The semiconductor device of claim 2, wherein the epitaxial region includes a second epitaxial region having a conduction type identical to that of the epitaxial region and an impurity concentration different from that of the epitaxial region, and the second epitaxial region is in contact with the source region.

8. The semiconductor device of claim 1, wherein the source region includes a second source region having an impurity concentration different from that of the source region.

9. The semiconductor device of claim 1, wherein the source region includes one selected from the group of crystalline silicon, amorphous silicon and a polycrystalline silicon.

* * * * *